United States Patent
Kozai et al.

(10) Patent No.: US 8,653,848 B2
(45) Date of Patent: Feb. 18, 2014

(54) TELEVISION APPARATUS, SEMICONDUCTOR PACKAGE, AND ELECTRONIC DEVICE

(75) Inventors: Tsuyoshi Kozai, Tokyo (JP); Nobuhiro Yamamoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 705 days.

(21) Appl. No.: 12/953,180

(22) Filed: Nov. 23, 2010

(65) Prior Publication Data

US 2011/0291694 A1 Dec. 1, 2011

(30) Foreign Application Priority Data

May 28, 2010 (JP) ................................. 2010-122231

(51) Int. Cl.
*G01R 31/28* (2006.01)
(52) U.S. Cl.
USPC .................................................... 324/763.01
(58) Field of Classification Search
USPC ............... 324/762.01–762.1, 763.01–763.02; 257/48; 438/14–18; 174/261–262; 361/226, 748, 828
See application file for complete search history.

(56) References Cited

U.S. PATENT DOCUMENTS

| 6,784,554 B2 * | 8/2004 | Kajiwara et al. ............... 257/778 |
| 7,915,088 B2 * | 3/2011 | Kobayashi et al. ........... 438/125 |
| 2007/0263369 A1 | 11/2007 | Takeochi et al. |

FOREIGN PATENT DOCUMENTS

| JP | 04-15865 | 2/1992 |
| JP | 05-335697 | 12/1993 |
| JP | 05-335749 | 12/1993 |
| JP | 11-145628 | 5/1999 |
| JP | 2005-005692 | 1/2005 |
| JP | 2006-114572 | 4/2006 |
| JP | 2007-305674 | 11/2007 |
| JP | 2009-206298 | 9/2009 |
| JP | 2010-245368 | 10/2010 |

OTHER PUBLICATIONS

Japanese Patent Application No. 2010-122231; Notice of Reasons for Rejection; Mailed Feb. 15, 2011 (English translation).
Japanese Patent Application No. 2010-122231; Notice of Reasons for Rejection; Mailed May 17, 2011 (English translation).

* cited by examiner

*Primary Examiner* — Tung X Nguyen
(74) *Attorney, Agent, or Firm* — Blakely, Sokoloff, Taylor & Zafman LLP

(57) ABSTRACT

According to one embodiment, a television apparatus includes a circuit board, a conductive portion, and an easily broken portion. The circuit board is mounted with an electronic component. The conductive portion is located on a surface or the inside of the circuit board. A breakage detection mechanism detects breakage of the conductive portion by conduction. The easily broken portion is provided to at least part of the conductive portion. The easily broken portion is broken easier than other portions of the conductive portion when a stress is applied to the circuit board.

7 Claims, 8 Drawing Sheets

TELEVISION APPARATUS, SEMICONDUCTOR PACKAGE, AND ELECTRONIC DEVICE

CROSS-REFERENCE TO RELATED APPLICATIONS

This application is based upon and claims the benefit of priority from Japanese Patent Application No. 2010-122231, filed May 28, 2010, the entire contents of which are incorporated herein by reference.

FIELD

Embodiments described herein relate generally to a television apparatus, a semiconductor package, and an electronic device.

BACKGROUND

There have been known printed circuit boards in which manufacturing failure such as wiring failure can be detected by conduction test (see, for example, Patent Application Publication (KOKAI) No. 2007-305674).

In this type of printed circuit boards, trouble may be caused in the circuit board, an electronic component, and the like due to heat, inertial force, external force acting after the manufacture, or the like.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments will be described hereinafter with reference to the accompanying drawings. In general, according to one embodiment, a television apparatus comprises a circuit board, a conductive portion, and an easily broken portion. The circuit board is configured to be mounted with an electronic component. The conductive portion is located on a surface or the inside of the circuit board. A breakage detection mechanism is configured to detect breakage of the conductive portion by conduction. The easily broken portion is provided to at least part of the conductive portion. The easily broken portion is configured to be broken easier than other portions of the conductive portion when a stress is applied to the circuit board.

According to another embodiment, a semiconductor package comprises a substrate, a conductive portion, and an easily broken portion. The substrate is configured to be mounted with a die. The conductive portion is located on a surface or the inside of the substrate. A breakage detection mechanism is configured to detect breakage of the conductive portion by conduction. The easily broken portion is provided to at least part of the conductive portion. The easily broken portion is configured to be broken easier than other portions of the conductive portion when a stress is applied to the circuit board.

According to still another embodiment, an electronic device comprises a circuit board, a conductive portion, and an easily broken portion. The circuit board is configured to be mounted with an electronic component. The conductive portion is located on a surface or the inside of the circuit board. A breakage detection mechanism is configured to detect breakage of the conductive portion by conduction. The easily broken portion is provided to at least part of the conductive portion. The easily broken portion is configured to be broken easier than other portions of the conductive portion when a stress is applied to the circuit board.

According to still another embodiment, an electronic device comprises a circuit board, a conductive portion, and an easily broken portion. The circuit board is configured to be mounted with an electronic component. The conductive portion is located on a surface or the inside of the circuit board. A breakage detection mechanism is configured to detect breakage of the conductive portion by conduction. The easily broken portion is provided to at least part of the conductive portion. The easily broken portion is configured to be broken by a stress exceeding a predetermined threshold.

Figure 1:
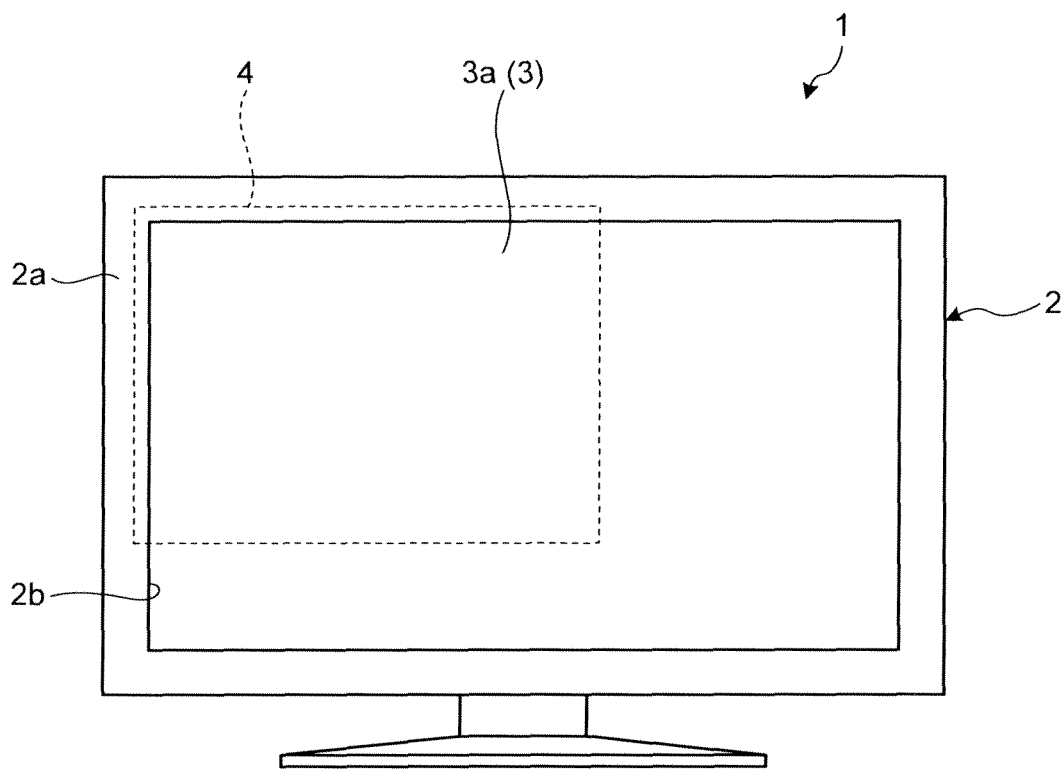
FIG. 1 is an exemplary front view of a television apparatus as an electronic device according to a first embodiment.

As illustrated in FIG. 1, a television apparatus 1 as an electronic device according to a first embodiment has a rectangular appearance in a front view (a plan view of the front surface). The television apparatus 1 comprises a housing 2, a display panel 3 as a display device, and a circuit board 4. The display panel 3 may be, for example, a liquid crystal display (LCD) panel, and has a display screen 3a which is exposed from an opening 2b formed in a front surface 2a of the housing 2. The circuit board 4 has an electronic component (not illustrated) mounted thereon. The display panel 3 and the circuit board 4 are fixed to the housing 2 with a screw (not illustrated) or the like.

The display panel 3 is formed into a flat rectangular parallelepiped shape in the front-back direction (the direction perpendicular to the plane of FIG. 1). The display panel 3 receives a video signal from a video signal processing circuit in a control circuit comprising an electronic component or the like (all not illustrated) mounted on the circuit board 4, thereby displaying video including a still image and a moving image on the display screen 3a on the front side. The control circuit of the television apparatus 1 comprises, in addition to the video signal processing circuit, a tuner, a high-definition multimedia interface (HDMI), a signal processor, an audio/video (AV) input terminal, a remote control signal receiver, a controller, a selector, an on-screen display interface, a storage module such as a read only memory (ROM), a random access memory (RAM), and a hard disk drive (HDD), and an audio signal processing circuit (all not illustrated). The circuit board 4 is housed behind the display panel 3 in the housing 2. The circuit board 4 can be mounted with at least part of a circuit constituting a breakage detection mechanism 5, which will be described later. The television apparatus 1 further comprises a built-in amplifier, speaker, and the like (all not illustrated) for outputting audio.

Figure 2:
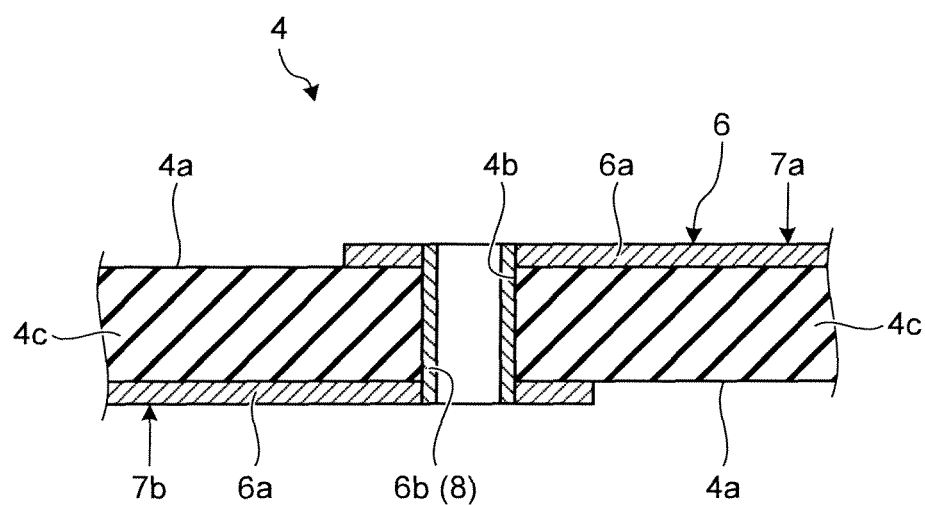
FIG. 2 is an exemplary cross-sectional view schematically illustrating part of a circuit board of the television apparatus in the first embodiment.
Figure 3:
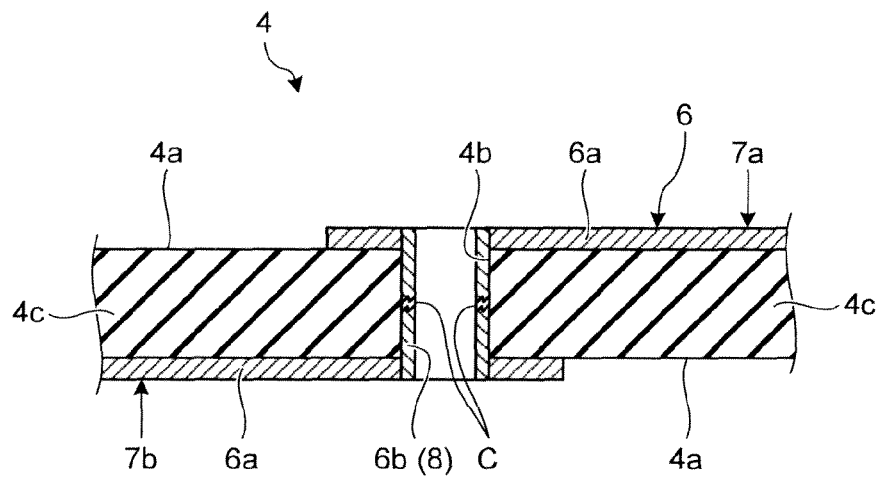
FIG. 3 is an exemplary cross-sectional view of the circuit board illustrated in FIG. 2 in which a conductive portion is broken in the first embodiment.
Figure 4:
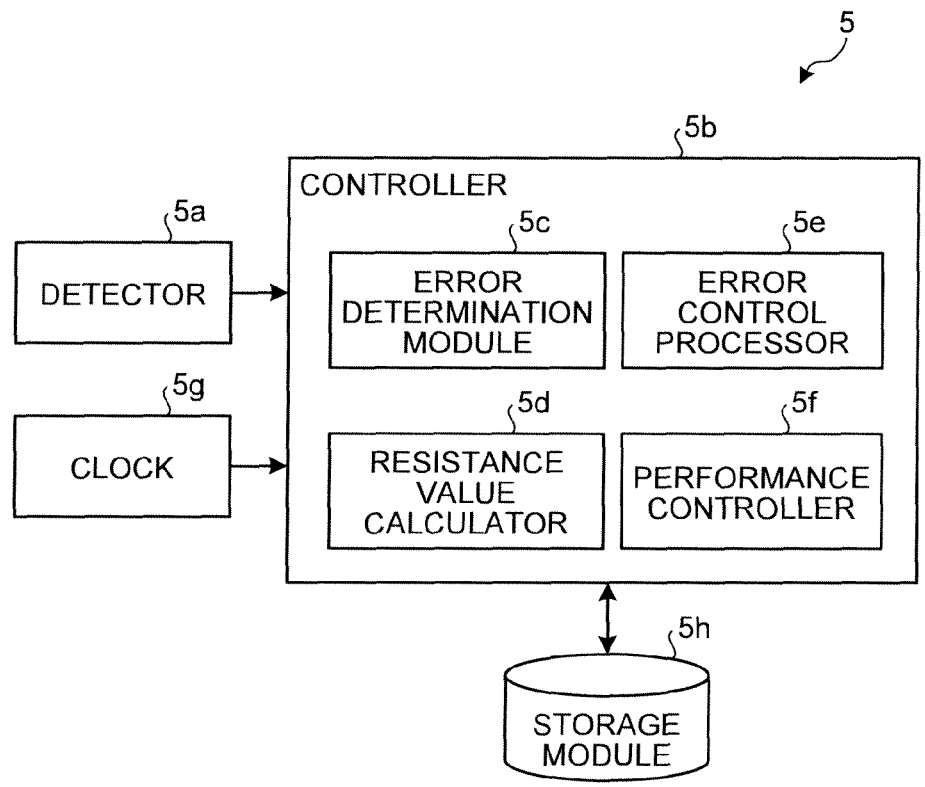
FIG. 4 is an exemplary block diagram of a breakage detection mechanism of the television apparatus in the first embodiment.

As illustrated in FIG. 2, a conductive portion 6 is provided to a front surface (including a back surface) 4a and inside of the circuit board 4. The breakage detection mechanism 5 (see FIG. 4) detects the breakage of the conductive portion 6 by conduction. The breakage detection mechanism 5 detects, for example, the conduction state between a first end 7a and a second end 7b of the conductive portion 6. More specifically, the breakage detection mechanism 5 detects a breakage C caused in the conductive portion 6 as illustrated in FIG. 3 as a change in the conduction state. For example, the breakage detection mechanism 5 detects whether there is the breakage C from a current value when a current is applied between the first end 7a and the second end 7b of the conductive portion 6 or the conduction state as a resistance value based on the current value. More specifically, for example, an error determination module 5c of a controller 5b illustrated in FIG. 4 compares a current value detected by a detector 5a with a predetermined threshold corresponding to the current value stored in a storage module 5h. If the detected current value is equal to or less than the predetermined threshold (including the case where the current value is 0), the error determination module 5c can determine that the breakage C occurs. Besides, the error determination module 5c compares a resistance value calculated by a resistance value calculator 5d based on a detected current value and an applied voltage value with a predetermined threshold corresponding to the resistance value stored in the storage module 5h. If the calculated resistance value is equal to or more than the predetermined threshold (including the case where the resistance value is infinity), the error determination module 5c can determine that the breakage C occurs. An error control processor 5e controls output modules such as a light emitting diode (LED), a lamp, a speaker, a buzzer, and the like to indicate that an error occurs. Alternatively, the error control processor 5e sends a signal indicating that an error occurs to the video signal processing circuit so that the video signal processing circuit can display video (an image) indicating that an error occurs on the display screen 3a of the display panel 3. The error control processor 5e may send a signal to a power switch circuit so that the power switch circuit can turn power off. A performance controller 5f of the controller 5b controls timing to perform a series of the above processes, i.e., breakage detection, error determination, and error control. More specifically, for example, a series of the above processes may be performed after the television apparatus 1 as an electronic device is turned on, before the completion of system activation, at predetermined time intervals (for example, every week), at a predetermined time, every predetermined times of power on, and the like. In this case, the storage module 5h stores various types of information related to the operation of the performance controller 5f. The performance controller 5f determines whether to perform a series of the above processes referring to the information stored in the storage module 5h, a clock 5g, and the like. The controller 5b may comprise a central processing unit (CPU) or the like. The storage module may comprise a nonvolatile storage device such as HDD, nonvolatile random access memory (NVRAM), or the like.

As illustrated in FIGS. 2 and 3, the conductive portion 6 comprises an outer layer 6a formed on the front surface 4a of the circuit board 4 and an inner circumference portion 6b as a conductive layer formed on the inner circumference surface of a through hole 4b formed in the circuit board 4. The outer layer 6a is electrically connected to the inner circumference portion 6b. The outer layer 6a may be formed by, for example, etching. The inner circumference portion 6b may be formed by, for example, electrolytic plating or non-electrolytic plating.

When a stress is applied to the circuit board 4 due to an external force, an inertial force, heat, or the like, in the first embodiment, as illustrated in FIG. 3, the inner circumference portion 6b is broken (the breakage C). The breakage resistance of the inner circumference portion 6b can be set appropriately according to the specifications (thickness, form, material, etc.) of the inner circumference portion 6b. That is, if the stress applied to the circuit board 4 due to an external force, an inertial force, heat, or the like reaches (exceeds) a predetermined threshold lower than a level at which an adverse effect occurs in an electronic component, the circuit board 4, or the like, the inner circumference portion 6b is broken and the breakage detection mechanism 5 detects the breakage C. In this manner, the protection of an electronic component, the circuit board 4, or the like can be increased. Thus, it is possible to prevent the erroneous operation of the television apparatus 1 as an electronic device due to the trouble of an electronic component, the circuit board 4, or the like before it occurs. In addition, the protection of data can also be increased. In the first embodiment, the inner circumference portion 6b corresponds to an easily broken portion 8 that is more fragile than other portions such as, for example, the outer layer 6a, etc. (broken before the others, broken first in the conductive portion 6). The inner circumference portion 6b as the easily broken portion 8 corresponds to a to-be-broken portion that is broken by stress exceeding a predetermined threshold (excessive stress).

Figure 5:
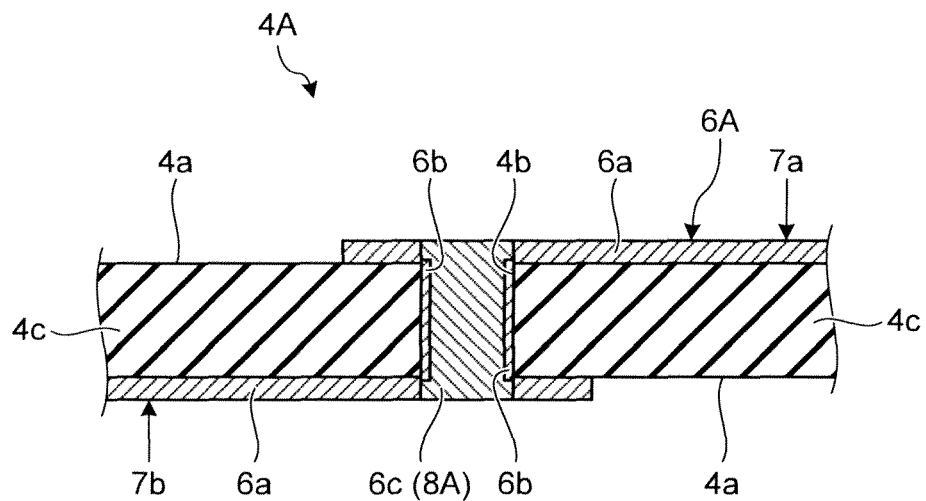
FIG. 5 is an exemplary cross-sectional view schematically illustrating part of a circuit board of a television apparatus according to a first modification of the first embodiment.
Figure 6:
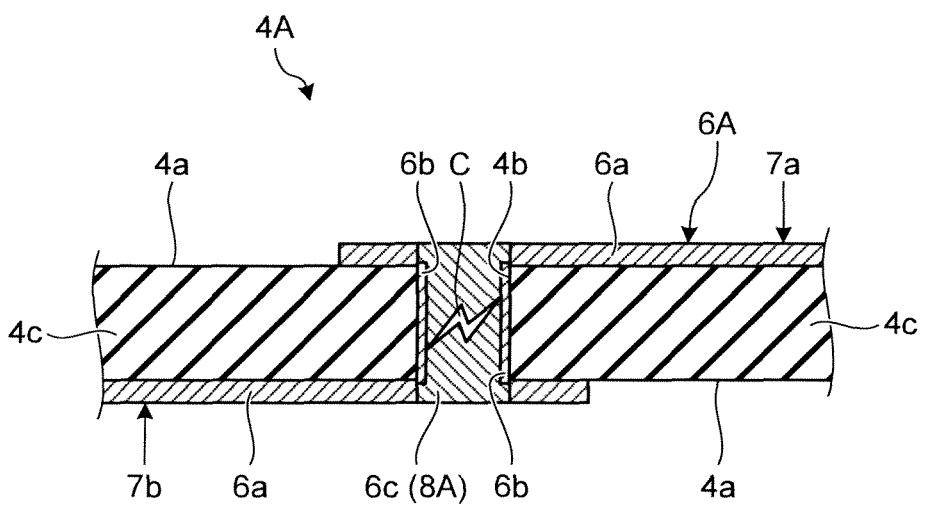
FIG. 6 is an exemplary cross-sectional view of the circuit board illustrated in FIG. 5 in which a conductive portion is broken in the first modification.

A description will be given of a first modification of the first embodiment with reference to FIGS. 5 and 6. In the first modification, a conductive portion 6A comprises the outer layer 6a, the inner circumference portion 6b, and a filling 6c. The inner circumference portion 6b is formed as a relatively thin conductive layer on the inner circumference surface of the through hole 4b formed in the circuit board 4 by, for example, non-electrolytic plating. The filling 6c may be, for example, conductive paste (conductive adhesive). The space inside the inner circumference portion 6b is filled with the filling 6c. In the first modification, the breakage detection mechanism 5 (see FIG. 4) detects the breakage of the conductive portion 6A. The breakage detection mechanism 5 detects, for example, the conduction state between the first end 7a and the second end 7b of the conductive portion 6A. More specifically, the breakage detection mechanism 5 detects the breakage C caused in the conductive portion 6A as illustrated in FIG. 6 as a change in the conduction state. The conductive portion 6A is capable of appropriately setting the breakage resistance of the filling 6c according to the specifications (material, size, etc.) of the filling 6c. That is, in the first modification, the breakage resistance of the filling 6c is lower than other portions (the outer layer 6a and the inner circumference portion 6b), and corresponds to an easily broken portion (a to-be-broken portion) 8A. In the first modification also, if the stress applied to a circuit board 4A due to an external force, an inertial force, heat, or the like reaches a predetermined threshold lower than a level at which an adverse effect occurs in an electronic component, the circuit board 4A, or the like, the easily broken portion 8A is broken and the breakage detection mechanism 5 detects the breakage C. In this manner, the protection of an electronic component, the circuit board 4A, or the like can be increased.

Figure 7:
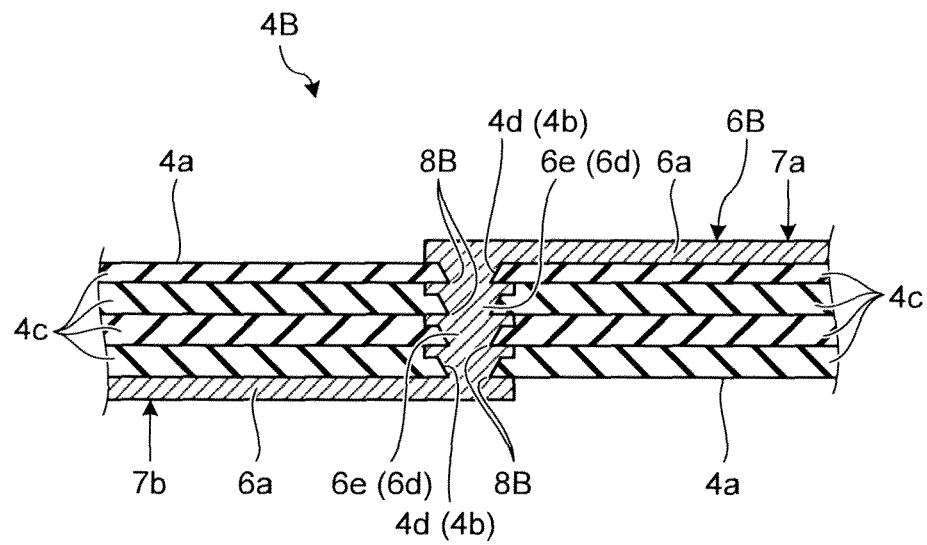
FIG. 7 is an exemplary cross-sectional view schematically illustrating part of a circuit board of a television apparatus according to a second modification of the first embodiment.
Figure 8:
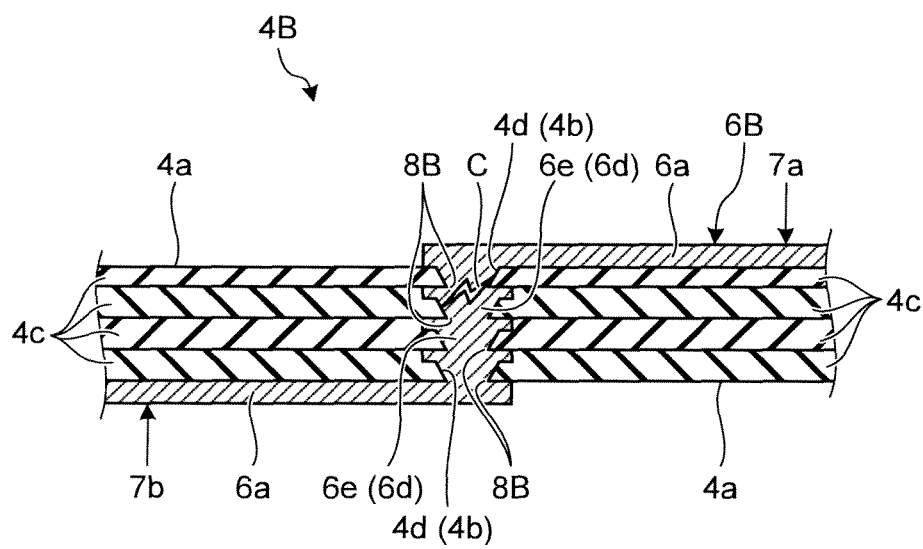
FIG. 8 is an exemplary cross-sectional view of the circuit board illustrated in FIG. 7 in which a conductive portion is broken in the second modification.

A description will be given of a second modification of the first embodiment with reference to FIGS. 7 and 8. In the second modification, a circuit board 4B is formed as a build-up circuit board (a multilayer circuit board) comprising a plurality of insulating layers 4c stacked one on top of another. A plurality of through holes 4d are formed in the insulating layers 4c, respectively. The through holes 4d overlapping in the thickness direction of the insulating layers 4c form the one through hole 4b. A filling 6d is formed in the through hole 4b by, for example, electrolytic plating or non-electrolytic plating. In the second modification, the breakage detection mechanism 5 (see FIG. 4) detects the breakage of the conductive portion 6A. The breakage detection mechanism 5 detects, for example, the conduction state between the first end 7a and the second end 7b of a conductive portion 6B. More specifically, the breakage detection mechanism 5 detects the breakage C caused in the conductive portion 6B as illustrated in FIG. 8 as a change in the conduction state. The filling 6d is formed of small conductive portions 6e overlapping in the through holes 4d of the respective insulating layers 4c. Since an adjacent pair of the small conductive portions 6e differ in diameter, a stepped portion (constriction) is formed at a boundary between the two adjacent small conductive portions 6e. Stress is concentrated at the stepped portion (constriction) due to an external force, an inertial force, heat, or the like, the boundary (the stepped portion) constitutes the origin of the breakage C. That is, in the second modification, a boundary (the stepped portion) between an adjacent pair of the small conductive portions 6e corresponds to an easily broken portion (a to-be-broken portion) 8B. In the second modification also, if the stress applied to the circuit board 4B due to an external force, an inertial force, heat, or the like reaches a predetermined threshold lower than a level at which an adverse effect occurs in an electronic component, the circuit board 4B, or the like, the easily broken portion 8B is broken and the breakage detection mechanism 5 detects the breakage C. In this manner, the protection of an electronic component, the circuit board 4B, or the like can be increased. Besides, with the stepped portion (constriction), the position of the easily broken portion 8B can be adjusted in the circuit board 4B.

Figure 9:
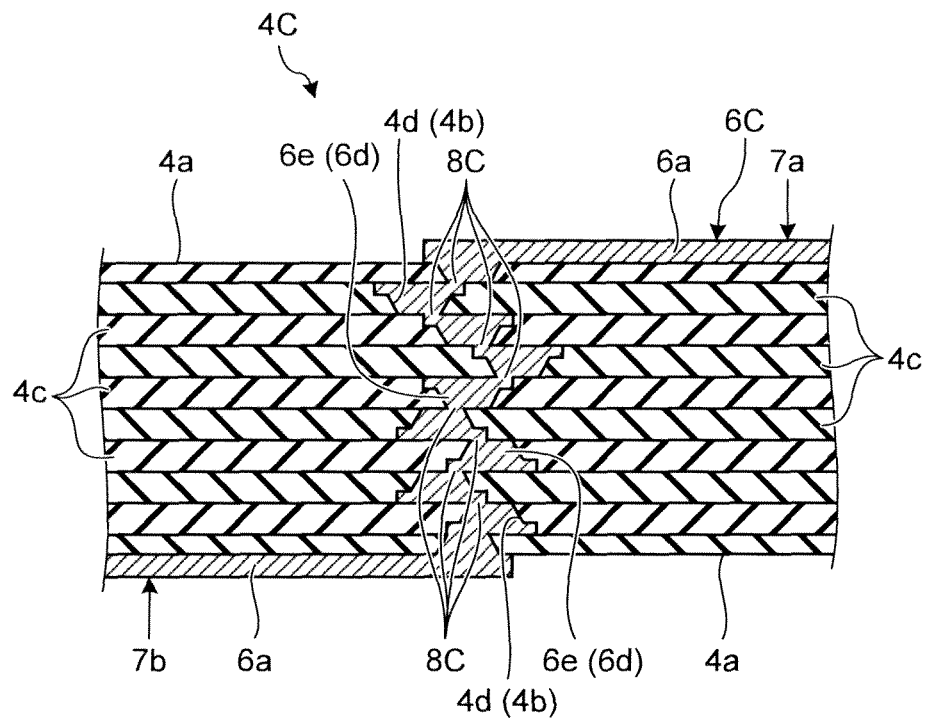
FIG. 9 is an exemplary cross-sectional view schematically illustrating part of a circuit board of a television apparatus according to a third modification of the first embodiment.

A description will be given of a third modification of the first embodiment with reference to FIG. 9. In the third modification also, a circuit board 4C is formed as a build-up circuit board comprising the plurality of insulating layers 4c stacked one on top of another. The circuit board 4C can be manufactured in the same manner as the circuit board 4B. In a conductive portion 6C of the third modification, an adjacent pair of the small conductive portions 6e are stacked in the thickness direction as being shifted with respect to each other. A stepped portion (constriction) is formed at a boundary between the two adjacent small conductive portions 6e. The difference in cross-sectional area is large among stepped portions between respective adjacent pairs of the small conductive portions 6e. Accordingly, stress is more easily concentrated at the stepped portion (constriction) due to heat, an external force, an inertial force, or the like acting on the circuit board 4C, and the boundary is more likely to constitute the origin of the breakage C. That is, in the third modification, a boundary (the stepped portion) between an adjacent pair of the small conductive portions 6e corresponds to an easily broken portion (a to-be-broken portion) 8C. In the third modification also, if the stress applied to the circuit board 4C due to an external force, an inertial force, heat, or the like reaches a predetermined threshold lower than a level at which an adverse effect occurs in an electronic component, the circuit board 4C, or the like, the easily broken portion 8C is broken and the breakage detection mechanism 5 detects the breakage C. In this manner, the protection of an electronic component, the circuit board 4C, or the like can be increased. Further, in the third modification, the boundary can be smaller compared to the second modification. Thus, the easily broken portion 8C can be easily provided, and the breakage resistance can be set lower. While FIG. 9 illustrates an example in which all the small conductive portions 6e are shifted, less number of the small conductive portions 6e may be shifted to reduce the number of the easily broken portions 8C, or the small conductive portions 6e may be shifted at a specific position to adjust the position of the easily broken portion 8C.

Figure 10:
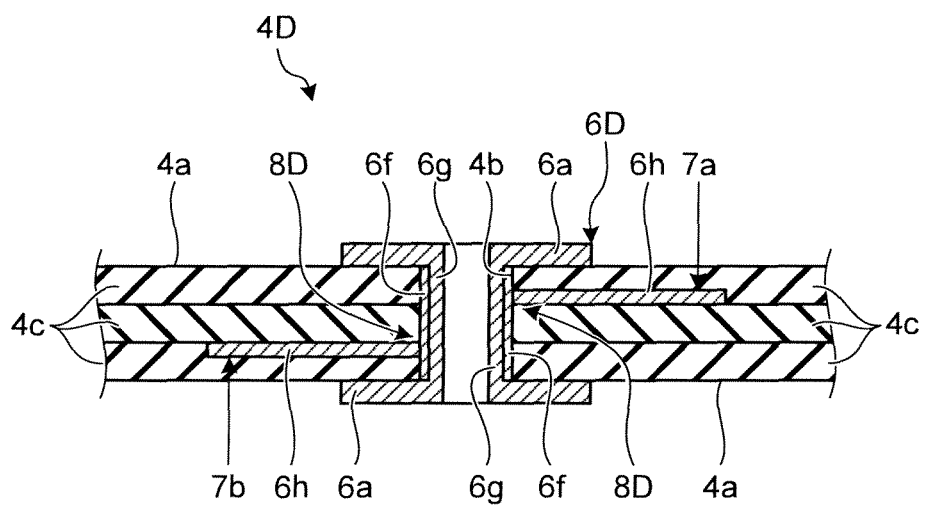
FIG. 10 is an exemplary cross-sectional view schematically illustrating part of a circuit board of a television apparatus according to a fourth modification of the first embodiment.

A description will be given of a fourth modification of the first embodiment with reference to FIG. 10. In the fourth modification also, as with the circuit board 4B of the second modification and the circuit board 4C of the third modification, a circuit board 4D is formed as a build-up circuit board comprising the plurality of insulating layers 4c stacked one on top of another. In the fourth modification, in place of the filling 6d, two inner circumference portions 6f and 6g are formed on the inner circumference surface of the through hole 4b. The inner circumference portion 6g is formed on the inner circumference surface of the circumference portion 6f by, for example, electrolytic plating. Further, in the fourth modification, inner layers 6h are formed on the surface of part of the insulating layers 4c as part of a conductive portion 6D. In the fourth modification, the breakage detection mechanism 5 (see FIG. 4) detects the breakage of the conductive portion 6D. The breakage detection mechanism 5 detects, for example, the conduction state between one of the inner layers 6h as the first end 7a and another of the inner layers 6h as the second end 7b of the conductive portion 6D. More specifically, the breakage detection mechanism 5 detects the breakage C caused in the conductive portion 6D as illustrated in FIG. 10 as a change in the conduction state. In the fourth modification, a boundary between the inner circumference portion 6g and the inner layers 6h corresponds to an easily broken portion (a to-be-broken portion) 8D. That is, the connection strength between the inner circumference portion 6g and the inner layers 6h is relatively low. Accordingly, if stress is applied to the circuit board 4D, the inner circumference portion 6g and the inner layers 6h are likely to be separate from each other at the boundary. In the fourth modification also, if the stress applied to the circuit board 4D due to an external force, an inertial force, heat, or the like reaches a predetermined threshold lower than a level at which an adverse effect occurs in an electronic component, the circuit board 4D, or the like, the easily broken portion 8D is broken and the breakage detection mechanism 5 detects the breakage C. In this manner, the protection of an electronic component, the circuit board 4D, or the like can be increased. While, in the fourth embodiment, the two inner circumference portions 6f and 6g are provided, only the inner circumference portion 6f may be provided by non-electrolytic plating, or other structures are possible.

In the structure of the fourth modification, the position of the easily broken portion 8D in the thickness direction of the circuit board 4D can be set variable depending on where the inner layers 6h is connected to the inner circumference portions 6f and 6g. For example, if the inner layers 6h are provided near the front surface 4a of the circuit board 4D, the easily broken portion 8D is located near the front surface 4a of the circuit board 4D. In other words, the easily broken portion 8D is located at an end of the circuit board 4D in the thickness direction. For another example, if the inner layers 6h are provided in the center of the circuit board 4D in the thickness direction, the easily broken portion 8D is located at the center of the circuit board 4D in the thickness direction. The heat stress tends to be large in the center of the circuit board 4D in the thickness direction. If an effect due to heat stress or the like is large, it is preferable to arrange the easily broken portion 8D in the center of the circuit board 4D in the thickness direction. The stress due to an external force tends to be large at an end of the circuit board 4D in the thickness direction (i.e., near the front surface 4a). If an effect due to an external force or the like is large, it is preferable to arrange the easily broken portion 8D at the end of the circuit board 4D in the thickness direction. The position of the easily broken portion can be appropriately adjusted also in the second modification and the third modification.

Figure 11:
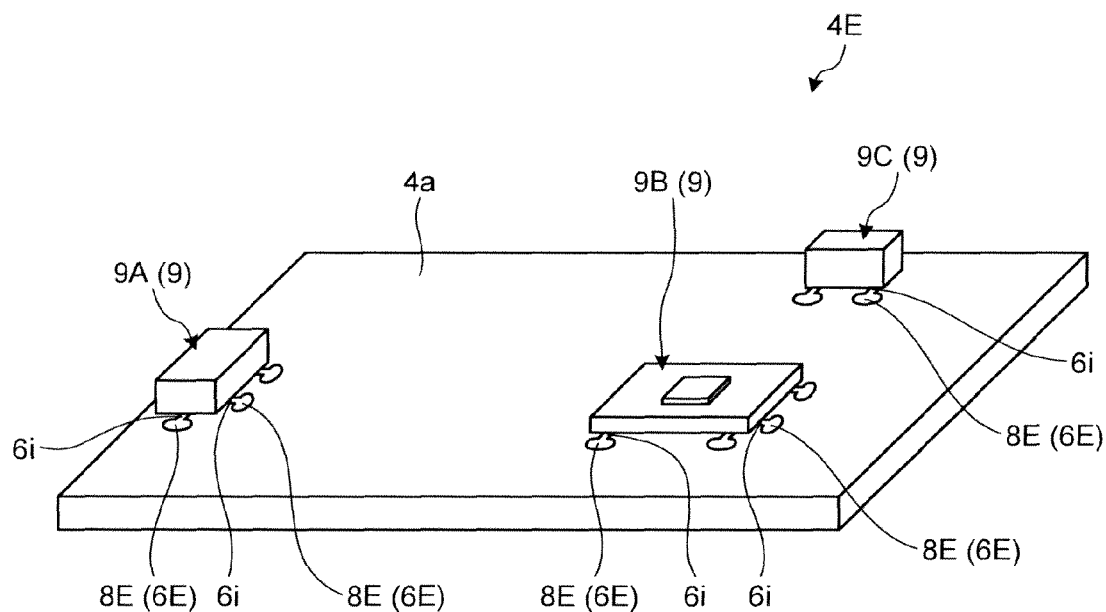
FIG. 11 is an exemplary perspective view schematically illustrating part of a circuit board of a television apparatus according to a fifth modification of the first embodiment.

A description will be given of a fifth modification of the first embodiment with reference to FIG. 11. In the fifth modification, as an electronic component 9, a universal serial bus (USB) connector 9A, a ball grid array (BGA) 9B, a power source connector 9C, and the like is mounted on a circuit board 4E. The breakage detection mechanism 5 (see FIG. 4) detects the breakage of a conductive portion 6E, which is located adjacent to a pad 6i. The terminal (not illustrated) of the electronic component 9 is soldered to the pad 6i. In the fifth modification, by detecting the breakage of the conductive portion 6E including an easily broken portion (a to-be-broken portion) 8E, it is possible to more reliably or effectively prevent the effect of an external force acting on the circuit board 4E, the effect due to an inertial force, heat, or the like on a portion where the terminal of the electronic component 9 is connected to the circuit board 4E, the electronic component 9, or the like. While FIG. 11 does not illustrate the detail of the structure of the conductive portion 6E including the easily broken portion 8E, the easily broken portion 8E and the conductive portion 6E of the fifth modification can be structured in the same manner as previously described in the first embodiment and the modifications thereof. In the fifth modification, the easily broken portion BE is provided in association with the USB connector 9A or the power source connector 9C. This facilitates to more reliably or effectively prevent an adverse effect from occurring in the electronic component 9, the circuit board 4E, or the like due to an external force.

Figure 12:
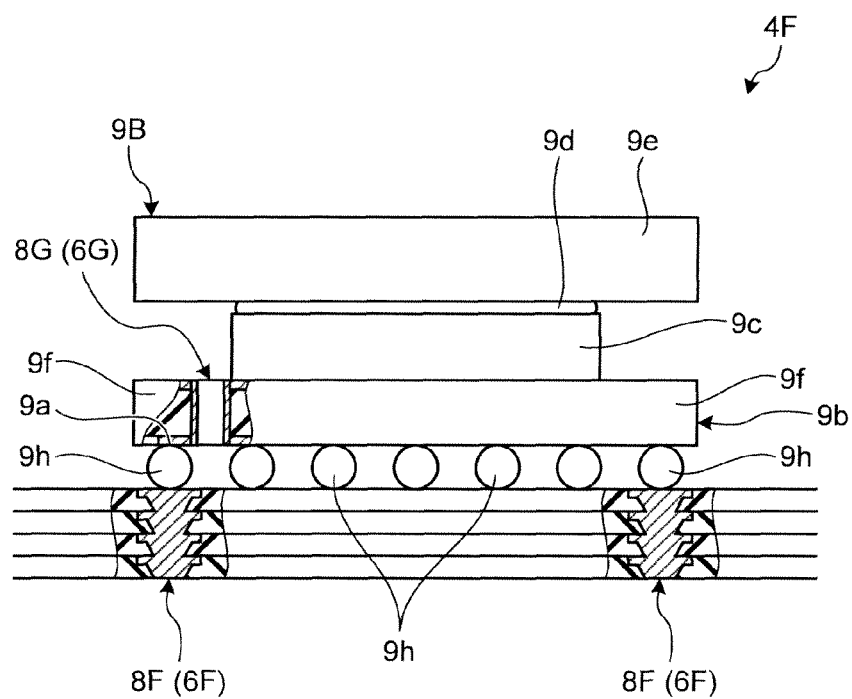
FIG. 12 is an exemplary side view (partly cross-sectional view) schematically illustrating part of a circuit board and a semiconductor package of a television apparatus according to a sixth modification of the first embodiment.

A description will be given of a sixth modification of the first embodiment with reference to FIG. 12. In the sixth modification, the breakage detection mechanism 5 (see FIG. 4) detects the breakage of a conductive portion 6F, which is located to face a terminal 9a of the BGA 9B (an example of a semiconductor package) as the electronic component 9. In the sixth modification, by detecting the breakage of the conductive portion 6F, it is possible to more reliably or effectively prevent the effect of an external force acting on a circuit board 4F, the effect due to an inertial force, heat, or the like on a portion where the terminal of the electronic component 9 is connected to the circuit board 4F, the BGA 9B, or the like. The conductive portion 6F has the same structure as the conductive portion 6B of the second modification, and comprises an easily broken portion (a to-be-broken portion) 8F similar to the easily broken portion 8B.

In the sixth modification, the conductive portion 6B is located to face an end 9f of the electronic component 9. When the circuit board 4F or the electronic component 9 is deformed, a force acting on a portion where the electronic component 9 is connected to the circuit board 4F is likely to be large at the end 9f (periphery) of the electronic component 9 rather than the center as the warp amount increases. Accordingly, in the sixth modification, the conductive portion 6F as an object of detection by the breakage detection mechanism 5 is arranged to face the end 9f of the electronic component 9. Thus, it is possible to more easily prevent an external force acting on the circuit board 4F, the effect due to an inertial force, heat, or the like on a portion where the terminal of the electronic component 9 is connected to the circuit board 4F, the BGA 9B, or the like.

The BGA 9B as a semiconductor package of the sixth modification comprises a substrate 9b, a die 9c, and a heat radiator 9e. The substrate 9b is mounted on the circuit board 4F. The die 9c is mounted on the substrate 9b. The heat radiator 9e is arranged on the die 9c through an adhesive 9d. In the sixth modification, as an object of detection by the breakage detection mechanism 5 (see FIG. 4), the conductive portion 6F having the same structure as the conductive portion 6 of the first embodiment is provided to the substrate 9b of the BGA 9B. An easily broken portion (a to-be-broken portion) 8G having the same structure of the easily broken portion 8 of the first embodiment is provided to the conductive portion 6F. In the sixth modification, if the stress applied to the substrate 9b of the BGA 9B as a semiconductor package due to an external force, an inertial force, heat, or the like reaches a predetermined threshold lower than a level at which an adverse effect occurs in the die 9c, the substrate 9b, or the like, the easily broken portion 8G is broken and the breakage detection mechanism 5 detects the breakage. In this manner, the protection of the die 9c, the substrate 9b, or the like can be increased. The substrate 9b may be mounted with the same structure as the conductive portion, the easily broken portion, and the like of the other modifications.

Figure 13:
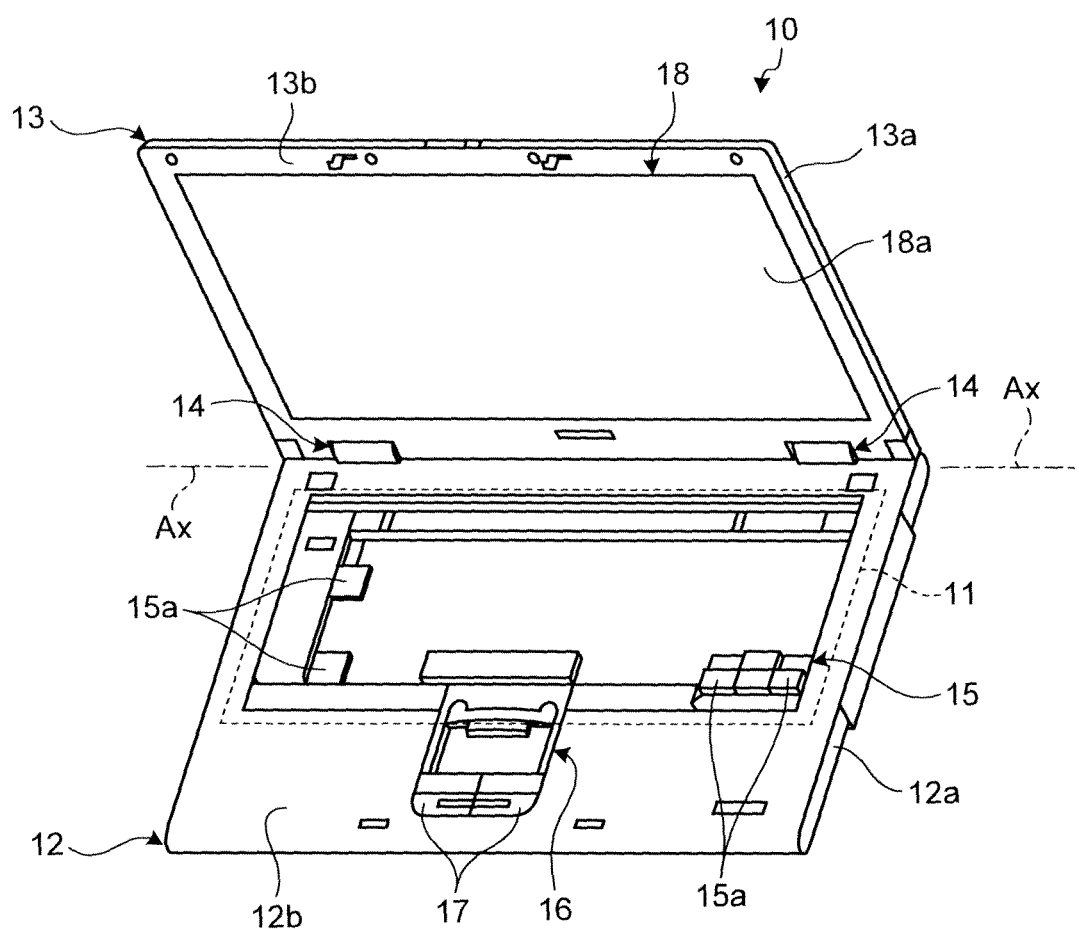
FIG. 13 is an exemplary perspective view of a personal computer as an electronic device according to a second embodiment.

A description will be given of an electronic device according to a second embodiment. As illustrated in FIG. 13, the electronic device of the second embodiment is, for example, a notebook personal computer (PC) 10. The PC 10 comprises a flat rectangular first body 12 and a flat rectangular second body 13. The first body 12 and the second body 13 are connected by a hinge mechanism 14 to be relatively rotatable about a rotation axis Ax between an open position as illustrated in FIG. 13 and a closed position (not illustrated).

The first body 12 is provided with a keyboard 15, a pointing device 16, a click button 17, and the like as input devices, which are exposed on a front surface 12b as the outer surface of a housing 12a. On the other hand, the second body 13 is provided with a display panel 18 as a display device (a component), which is exposed on a front surface 13b as the outer surface of a housing 13a. The display panel 18 may be, for example, a liquid crystal display (LCD) panel. When the PC 10 is in the open position, the keyboard 15, the pointing device 16, the click button 17, a display screen 18a of the display panel 18, and the like are exposed to allow the user to use them. On the other hand, in the closed position, the front surface 12b closely faces the front surface 13b, and the keyboard 15, the pointing device 16, the click button 17, the display panel 18, and the like are covered between the housings 12a and 13a. Incidentally, FIG. 13 does not illustrate all keys of the keyboard 15 but only keys 15a.

The housing 12a of the first body 12 or the housing 13a of the second body 13 (in the second embodiment, only the housing 12a) houses a circuit board 11 the same as the circuit boards 4 and 4A to 4F previously described in the first embodiment and the first to the sixth modifications thereof.

The display panel 18 receives a display signal from a control circuit comprising an electronic component or the like (all not illustrated) mounted on the circuit board 11, thereby displaying video including a still image and a moving image. The control circuit of the PC 10 comprises a control module, a storage module such as ROM, RAM, and HDD, an interface circuit, and various controllers (all not illustrated). The circuit board 11 may be mounted with at least part of circuit that constitutes the breakage detection mechanism 5 illustrated in FIG. 4. The PC 10 further comprises a built-in speaker and the like (not illustrated) for outputting audio.

The circuit board 11 is provided with a conductive portion and an easily broken portion (a to-be-broken portion) basically the same as the conductive portions 6 and 6A to 6G and the easily broken portions 8 and 8A to 8G previously described in the first embodiment and the first to the sixth modifications thereof. The breakage detection mechanism 5 performs the breakage detection, the error determination, and the error control as described above. Thus, the PC 10 of the second embodiment can achieve the same effect as the first embodiment.

Figure 14:
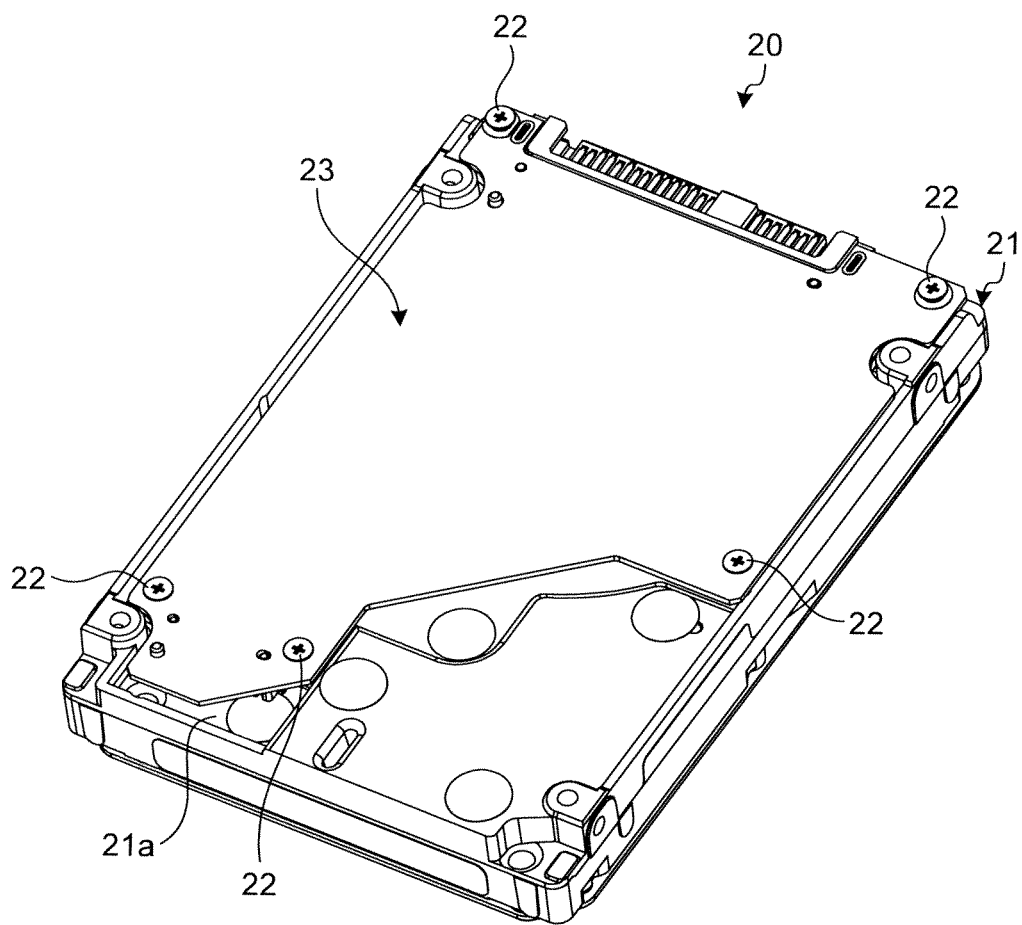
FIG. 14 is an exemplary perspective view of a magnetic disk device as an electronic device according to a third embodiment.

A description will be given of an electronic device according to a third embodiment. As illustrated in FIG. 14, the electronic device of the third embodiment is, for example, a magnetic disk device 20. The magnetic disk device 20 comprises a flat rectangular parallelepiped housing 21 and a circuit board (printed circuit board) 23. The housing 21 houses components such as a magnetic disk (not illustrated). The circuit board 23 is attached to the housing 21 with a fastener member such as a screw 22.

The circuit board 23 is located on an upper wall 21a of the housing 21. A film-like insulating sheet (not illustrated) is located between the circuit board 23 and the upper wall 21a. In the third embodiment, the back surface of the circuit board 23 in a view of FIG. 14, i.e., the back surface (not illustrated) of the circuit board 23 facing the upper wall 21a is amount surface where a plurality of electronic components are mounted. The circuit board 23 is provided with a wiring pattern (not illustrated) on the front and back surfaces. Needless to say, electronic components may be mounted on the front surface of the circuit board 23.

The foregoing embodiments are susceptible to considerable variation in the practice. For example, while the embodiment is described above as being applied to a television apparatus, a notebook PC, and a magnetic disk device, the embodiments may be applied to other electronic devices having a circuit board. The specifications (structure, form, size, depth, thickness, cross-sectional area, weight, number, material, arrangement, location, etc.) can be changed as required for the circuit board, the electronic component, the breakage detection mechanism, the conductive portion, the easily broken portion, the to-be-broken portion, the conductive layer, the insulating layer, the small conductive portion, the boundary, the stepped portion, the through portion, the inner layer, the pad, the semiconductor package, the substrate, the die, and the like.

The hole formed in the circuit board may be a blind via hole, a buried hole, or the like, the number and location of the inner layer connected to the conductive portion may be changed as appropriate.

A recessed portion, a groove, a notch, a hole, a portion where the cross-sectional area or the shape suddenly changes, or the like may be formed in the conductive portion to form the easily broken portion (the to-be-broken portion). This increases the effect of stress concentration on the easily broken portion. Thus, the conductive portion can be more reliably broken at the easily broken portion.

As an object of detection by the breakage detection mechanism, the conductive portion may be formed as a conductive portion dedicated for the breakage detection or as part of another functional circuit. It is obvious that the breakage detection mechanism can detect a manufacturing failure.

Alternatively, the conductive portion may be formed as a conductive layer of a through hole into which a pin provided to an electronic component is inserted. In this case, the pin may be, for example, a signal pin or a reinforcing pin. The electronic component need not necessarily be soldered on the circuit board, but may be joined to the circuit board by screwing or any other way. The conductive portion may be grounded.

A computer program can be executed by a controller such as CPU to realize the same function as the breakage detection mechanism described above. In this case, the controller executes the computer program loaded into RAM or the like to implement the operation of the breakage detection mechanism. The computer program includes modules corresponding to the detector, the controller, the error determination module, the resistance value calculator, the error control processor, the performance controller, and the like. The computer program may be installed from a storage medium such as a compact disc-read only memory (CD-ROM) on a nonvolatile storage medium such as HDD.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a circuit board on which an electronic component is mounted;
   a conductive portion located on a surface or an inside of the circuit board whose breakage is configured to be detected by conduction; and
   an easily broken portion provided to at least part of the conductive portion, the easily broken portion configured to be broken easier than other portions of the conductive portion when a stress is applied to the circuit board, wherein
      the circuit board comprises a plurality of insulating layers stacked one on top of another,
   the conductive portion comprises small conductive portions configured to pass through the insulating layers adjacent to one another in a thickness direction of the circuit board, respectively, and overlap in the thickness direction, and the easily broken portion is a stepped portion formed at a boundary between an adjacent pair of the small conductive portions.

2. The electronic device of claim 1, wherein the easily broken portion is located in a center of the circuit board in the thickness direction of the circuit board.

3. The electronic device of claim 1, wherein the easily broken portion is located at an end of the circuit board in the thickness direction of the circuit board.

4. The electronic device of claim 1, wherein the conductive portion is located adjacent to a pad to which a terminal of the electronic component is connected.

5. The electronic device of claim 1, wherein the conductive portion is located to face an end of the electronic component.

6. An electronic device comprising:
a circuit board on which an electronic component is mounted;
a conductive portion located on a surface or an inside of the circuit board whose breakage is configured to be detected by conduction; and
an easily broken portion provided to at least part of the conductive portion, the easily broken portion configured to be broken easier than other portions of the conductive portion when a stress is applied to the circuit board, wherein
the circuit board comprises a plurality of insulating layers stacked one on top of another,
the conductive portion comprises small conductive portions configured to pass through the insulating layers adjacent to one another in a thickness direction of the circuit board, respectively, and overlap in the thickness direction as being shifted from one another, and
the easily broken portion is a boundary between an adjacent pair of the small conductive portions.

7. An electronic device comprising:
a circuit board on which an electronic component is mounted;
a conductive portion located on a surface or an inside of the circuit board whose breakage is configured to be detected by conduction; and
an easily broken portion provided to at least part of the conductive portion, the easily broken portion configured to be broken easier than other portions of the conductive portion when a stress is applied to the circuit board, wherein
the circuit board comprises a plurality of insulating layers stacked one on top of another,
the conductive portion comprises
a through portion configured to at least partly pass through the insulating layers in a thickness direction of the circuit board, and
an inner layer formed along a surface of the insulating layers, the inner layer configured to be connected to the through portion by conduction, and
the easily broken portion is a boundary between the through portion and the inner layer.

\* \* \* \* \*